(12) United States Patent
Ciminello et al.

(10) Patent No.: US 7,904,269 B2
(45) Date of Patent: *Mar. 8, 2011

(54) OVERHEAD TRAVELING VEHICLE TESTING AND CALIBRATION

(75) Inventors: Nicholas F. Ciminello, White Plains, NY (US); Ray A. Reyes, New Windsor, NY (US); David L. Schmoke, Verbank, NY (US); Uldis A. Ziemins, Pougkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 69 days.

This patent is subject to a terminal disclaimer.

(21) Appl. No.: 11/928,740

(22) Filed: Oct. 30, 2007

(65) Prior Publication Data

US 2008/0046198 A1 Feb. 21, 2008

Related U.S. Application Data (63) Continuation of application No. 10/669,849, filed on Sep. 24, 2003, now Pat. No. 7,356,428.

(51) Int. Cl.
*G06F 19/00* (2006.01)
(52) U.S. Cl. ........................................ 702/104
(58) Field of Classification Search .................. 702/104
See application file for complete search history.

(56) References Cited

U.S. PATENT DOCUMENTS

| | | | |
|---|---|---|---|
| 3,263,625 A | 8/1966 | Midis et al. | |
| 4,016,754 A | 4/1977 | Wiss | |
| 5,392,640 A | 2/1995 | Fukuda et al. | |
| 5,583,797 A | 12/1996 | Fluegge et al. | |
| 5,711,021 A * | 1/1998 | Book | 701/33 |
| 5,803,278 A | 9/1998 | Shiwaku | |
| 6,113,341 A * | 9/2000 | Fukushima | 414/663 |
| 6,504,144 B1 * | 1/2003 | Murata | 250/224 |
| 6,715,978 B2 | 4/2004 | Lin et al. | |
| 6,813,939 B1 | 11/2004 | Wilcoxon | |
| 6,857,529 B2 | 2/2005 | Lopez Alba | |
| 6,884,989 B2 | 4/2005 | Murata | |
| 7,040,026 B2 | 5/2006 | Hirano et al. | |
| 2002/0197136 A1 | 12/2002 | Huang et al. | |
| 2003/0198553 A1 | 10/2003 | Lin et al. | |
| 2004/0118980 A1 | 6/2004 | Chang et al. | |
| 2005/0079041 A1 | 4/2005 | Campbell et al. | |

(Continued)

OTHER PUBLICATIONS

Bhat, U.S. Appl. No. 10/669,849, Office Action Communication, Dec. 15, 2005, 8 pages.

(Continued)

*Primary Examiner* — Aditya Bhat
(74) *Attorney, Agent, or Firm* — Ian D. MacKinnon; Hoffman Warnick LLC (57) ABSTRACT

A method, system and test fixture for allowing testing and calibration of various operation parameters of an overhead traveling vehicle (hereinafter "OTV") are disclosed. The invention implements a test fixture that includes a rotatable bearing set for rotatably engaging a wheel of the OTV such that the wheel can rotate but the OTV remains stationary. The bearing set is held in a raised position, similar to the operational position of the OTV, by a raised support. The test fixture may also include a reflective tape for use with an optical sensor(s) of the OTV. In this fashion, operation parameters of the OTV such as drive servomotor velocity, current gain, current offset, OTV travel profile, optical sensor op-amp gain, etc., can be tested and calibrated.

15 Claims, 7 Drawing Sheets

U.S. PATENT DOCUMENTS

2006/0108157 A1 5/2006 Brazier
2008/0307855 A1* 12/2008 Friedman et al. ............ 73/12.09

OTHER PUBLICATIONS

Bhat, U.S. Appl. No. 10/669,849, Office Action Communication, Sep. 5, 2006, 8 pages.
Bhat, U.S. Appl. No. 10/669,849, Office Action Communication, May 24, 2006, 9 pages.
Bhat, U.S. Appl. No. 10/669,849, Office Action Communication, Feb. 22, 2007, 8 pages.
Bhat, U.S. Appl. No. 10/669,849, Office Action Communication, Jul. 10, 2007, 8 pages.
Bhat, U.S. Appl. No. 10/669,849, Notice of Allowance & Fees Due, Jan. 11, 2008, 6 pages.

* cited by examiner

OVERHEAD TRAVELING VEHICLE TESTING AND CALIBRATION

CROSS-REFERENCE TO RELATED APPLICATIONS

The current application is a continuation application of U.S. patent application Ser. No. 10/669,849, now U.S. Pat. No. 7,356,428 filed on Sep. 24, 2003, which is hereby incorporated by reference.

BACKGROUND OF THE INVENTION

1. Technical Field

The present invention relates generally to automated overhead traveling vehicles, and more particularly to a method, system and test fixture for allowing testing and calibration of an overhead traveling vehicle.

2. Related Art

Figure 1:
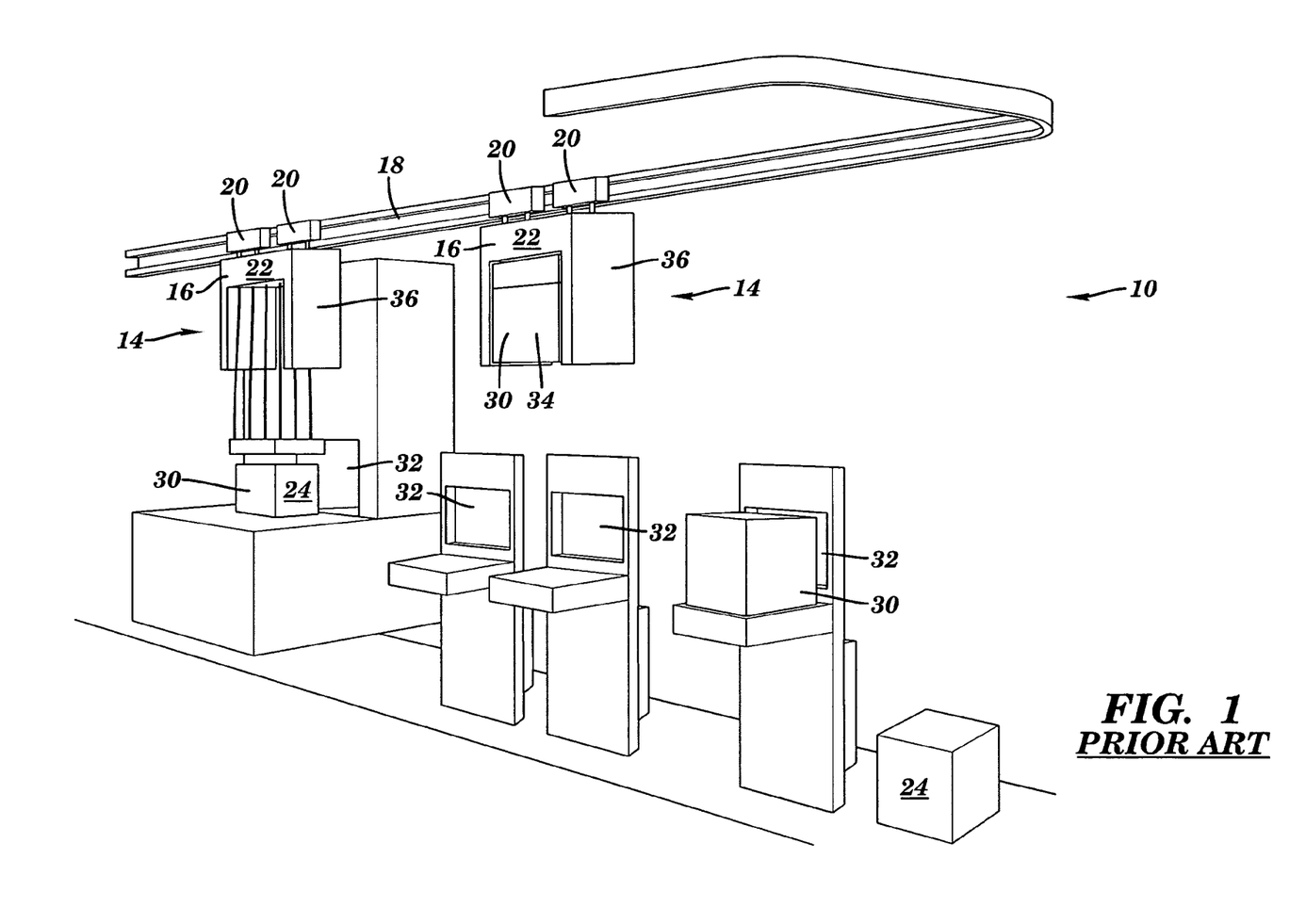
FIG. 1 shows a perspective view of a prior art overhead traveling vehicle system.

Semiconductor fabrication facilities use automation for delivery of wafers between processing stations that include bays therebetween. In one approach, wafer holding pods are delivered via a system of overhead traveling vehicles in which each vehicle is mounted to, and movable on, a rail that is positioned over the necessary load ports. Referring to FIG. 1, an illustrative overhead traveling vehicle system 10 for use in a semiconductor fabrication facility is shown. System 10 includes at least one and, in most cases, a plurality of overhead traveling vehicles 14. Each vehicle 14 includes a main body 16 movably engaged with an elevated rail 18, and including a servomotor(s) 20 for driving a wheel(s) (not shown) for moving main body 16 along elevated rail 18. Main body 16 provides a base point 22 from which hoisting of an object may occur. Elevated rail 18 may be supported in a variety of ways such as being hung from a ceiling of the facility or supported on poles. System 10 may also include a controller 24 for controlling a plurality of overhead traveling vehicles 14 in the semiconductor fabrication facility. Tracking of overhead traveling vehicles 14 may be conducted via one or more optical sensors (not shown) that interact with a reflective tape (not shown) on rail 18.

As with any automated device, vehicles must be periodically taken out of service for repair and other maintenance, and temporarily swapped or replaced with a second vehicle. Typically each facility has an automation system that has been implemented over time such that vehicles do not always have mechanical and electrical uniformity. Accordingly, when a problem vehicle is replaced by a second vehicle, the calibration data for the problem vehicle oftentimes is incompatible with the second vehicle. Accordingly, the second vehicle malfunctions, or worse is inoperable. The reasons for this situation vary, e.g., different vehicle age, models, components, etc. One example malfunction is non-synchronization of drive servomotors for wheels of the second vehicle, which may result in dangerous operation of the vehicle. Conventionally, system operators would simply accept the malfunction or make estimated corrections to the second vehicle to minimize the malfunction.

In view of the foregoing, there is a need in the art for a method, system and test fixture for allowing testing and calibration of overhead traveling vehicles.

SUMMARY OF THE INVENTION

The invention includes a method, system and test fixture for allowing testing and calibration of various operation parameters of an overhead traveling vehicle (hereinafter "OTV"). The invention implements a test fixture that includes a rotatable bearing set for rotatably engaging a wheel of the OTV such that the wheel can rotate but the OTV remains stationary. The bearing set is held in a raised position, similar to the operational position of the OTV, by a raised support. The test fixture may also include a reflective tape for use with an optical sensor(s) of the OTV. In this fashion, operation parameters of the OTV, such as drive servomotor velocity, current gain, current offset, OTV travel profile, optical sensor op-amp gain, etc., can be tested and calibrated.

A first aspect of the invention is directed to a system for testing an overhead traveling vehicle, the system comprising: a test fixture for supporting the overhead traveling vehicle during analysis in a stationary state, the test fixture including a rotatable bearing set for rotatably engaging a wheel of the overhead traveling vehicle during testing; and a data collector for collecting data regarding an operation parameter of the overhead traveling vehicle.

A second aspect of the invention is directed to a test fixture for supporting an overhead traveling vehicle for testing, the test fixture comprising: a rotatable bearing set for rotatably engaging a wheel of the overhead traveling vehicle such that the wheel can rotate but the overhead traveling vehicle remains stationary; and a raised support for supporting the rotatable bearing set.

A third aspect of the invention is directed to a method of calibrating an overhead traveling vehicle, the method comprising: supporting the overhead traveling vehicle on a test fixture, in a stationary state, by rotatably supporting each wheel of the overhead traveling vehicle with a rotatable bearing set including a pair of rotatable bearings; operating a portion of the overhead traveling vehicle; and adjusting a control of the overhead traveling vehicle to calibrate the overhead traveling vehicle.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

Figure 2A:
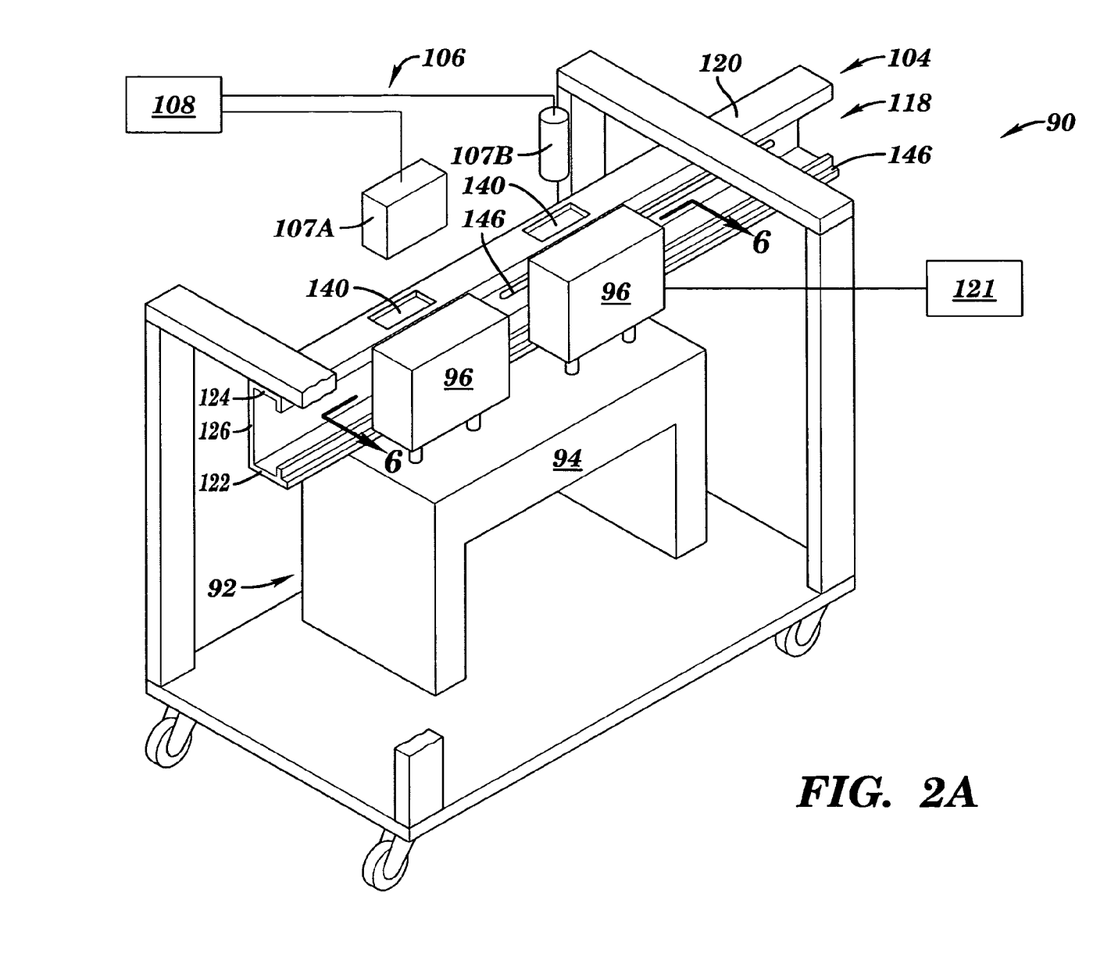
FIGS. 2A-2B show perspective views of a test fixture and testing system according to the invention.
Figure 2B:
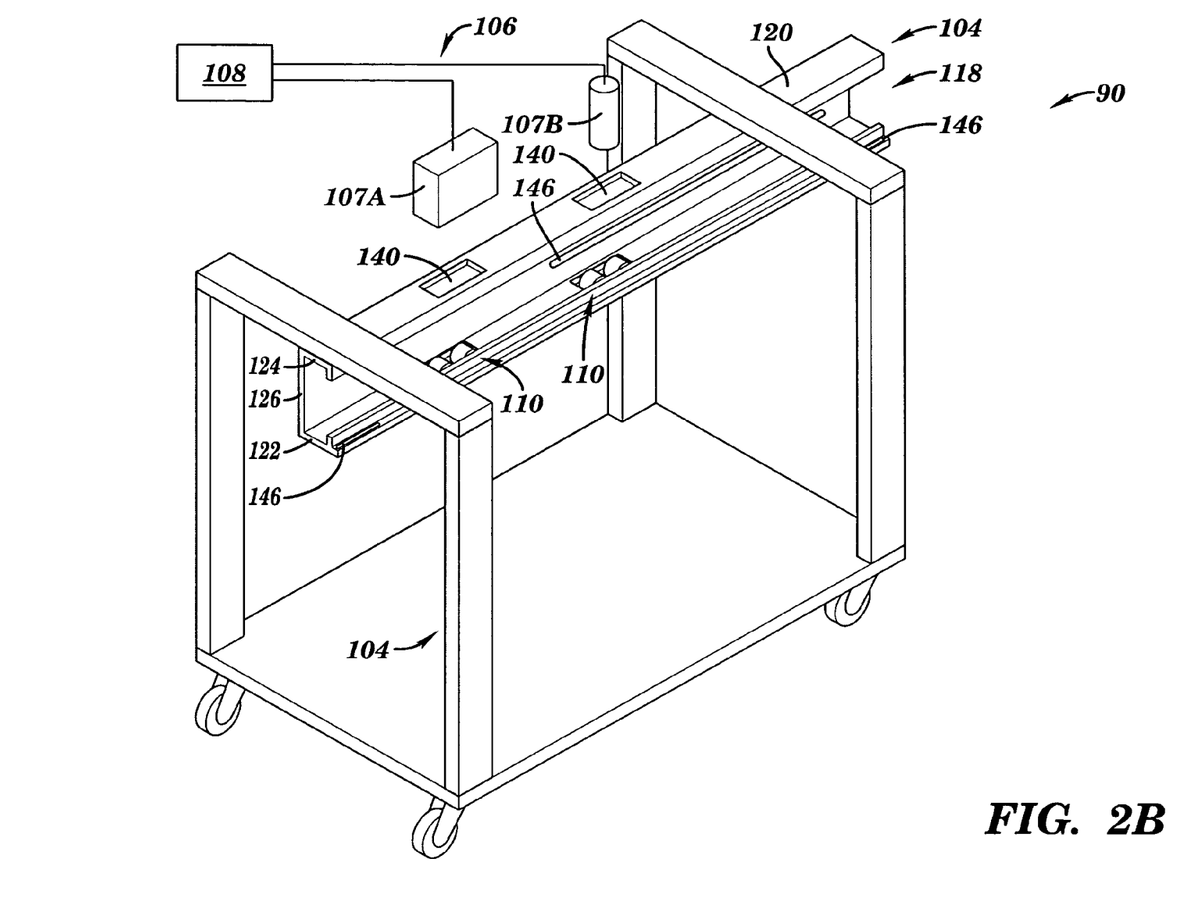
Figure 3:
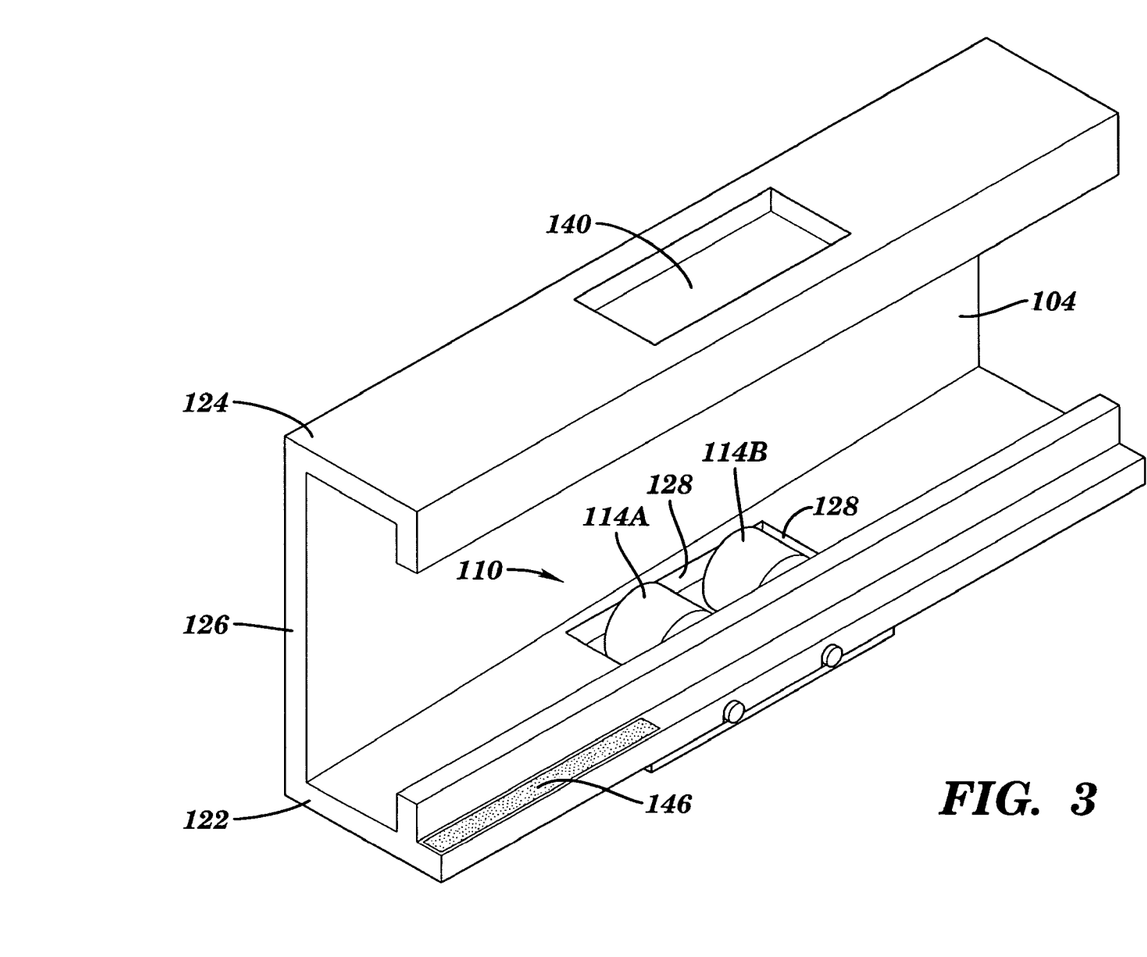
FIG. 3 shows an underside view of the test fixture of FIGS. 2A-2B.
Figure 4:
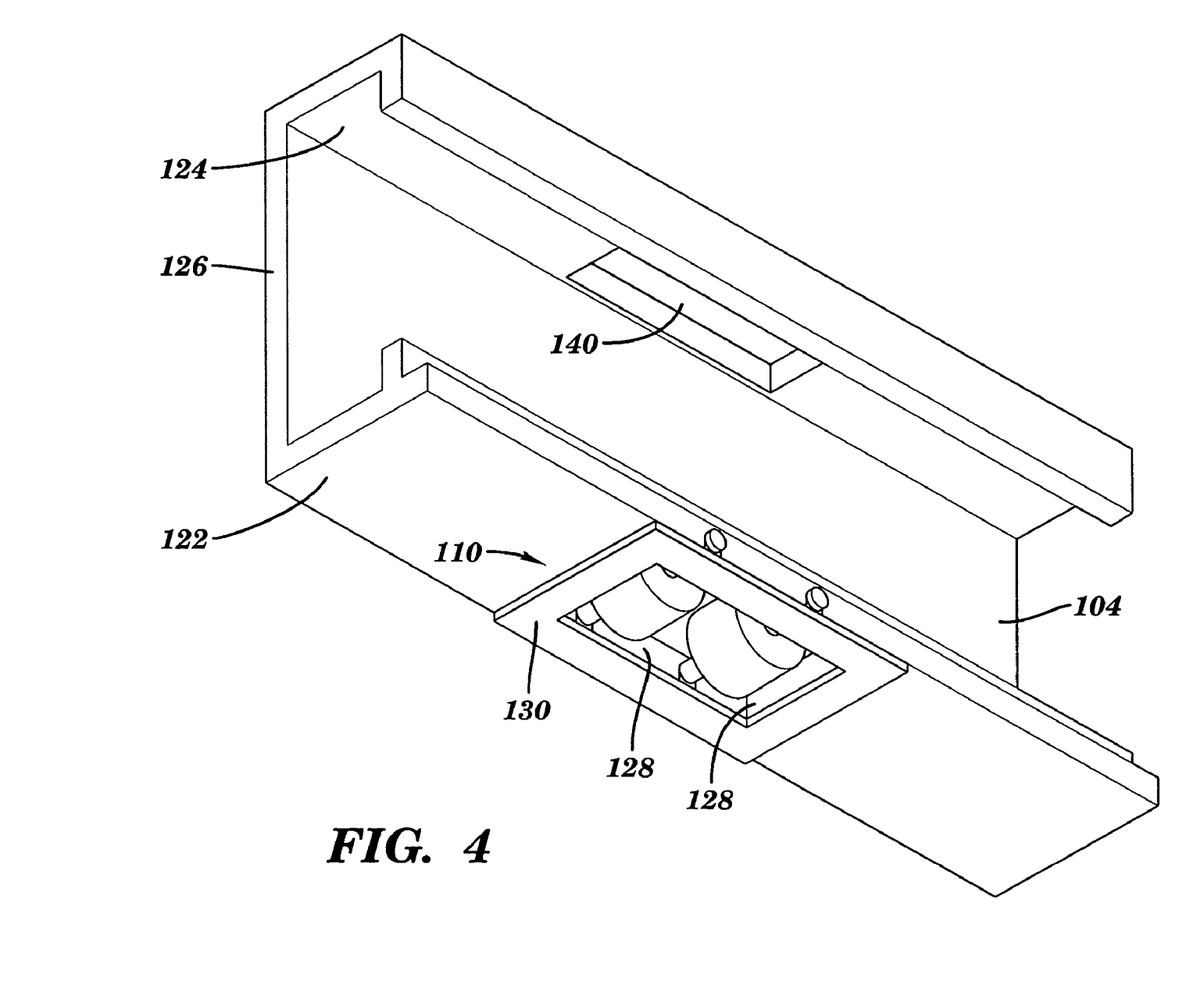
FIG. 4 shows a close up view of a bearing set of the test fixture of FIGS. 2A-2B.

With reference to the accompanying drawings, FIGS. 2A-2B show a testing system 90 for testing and calibrating an overhead traveling vehicle (OTV) 92 (FIG. 2A only). As noted above, each OTV 92 may include a main body 94 including a servomotor(s) 96 for driving a wheel(s) 98 (FIG. 5) that moves main body 94 along an elevated rail (not shown). Main body 94 provides a base point from which hoisting of an object may occur. Each OTV 92 may also include one or more optical sensors 100 (FIG. 6) that interact with a reflective section (not shown) on a rail for feedback to a controller for controlling operation of OTV 92.

Figure 5:
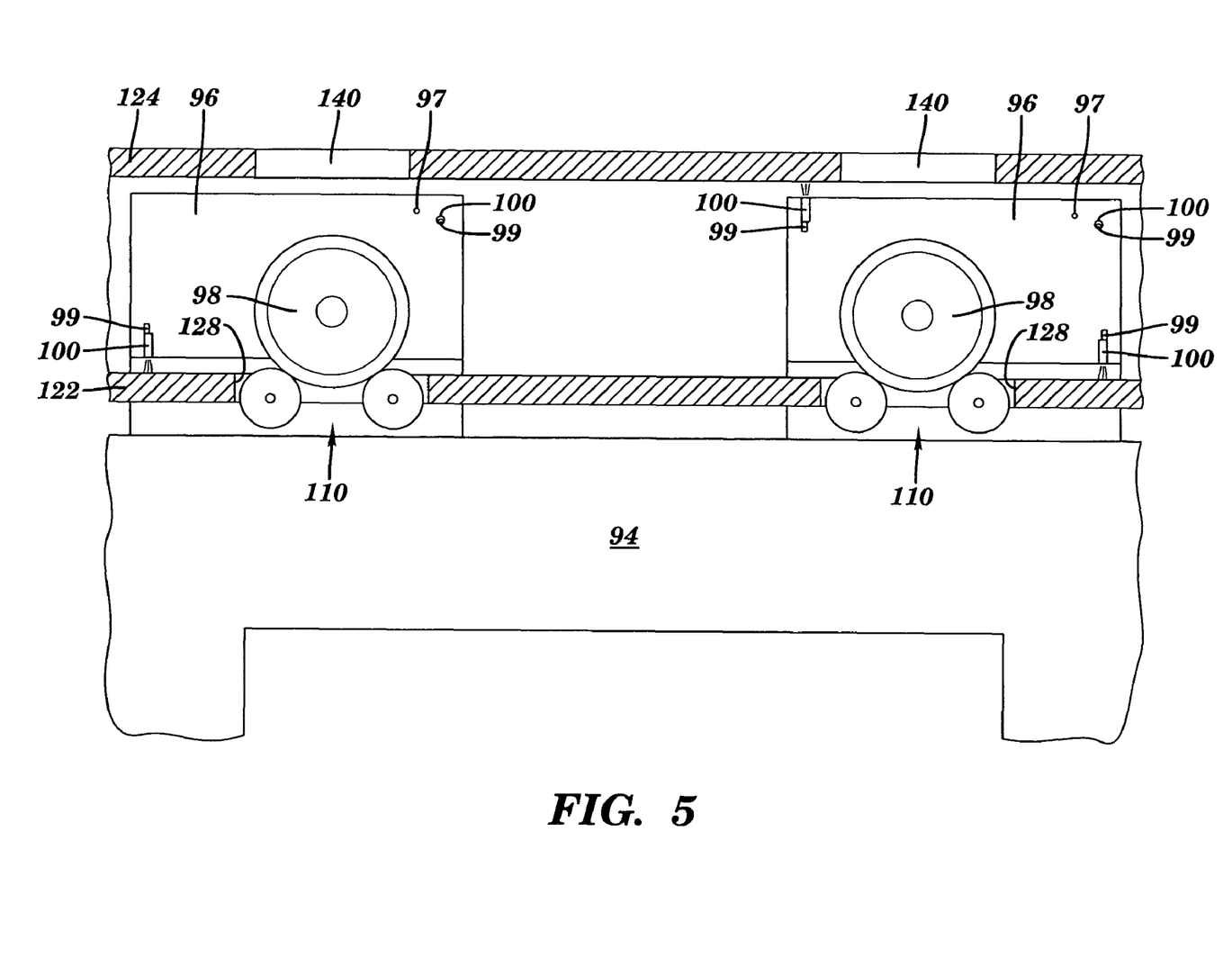
FIG. 5 shows a view through a data collector opening in the test fixture of FIGS. 2A-2B.

Testing system 90 includes a test fixture 104 and a data collector 106. As shown in FIG. 2A, test fixture 104 supports OTV 92 in substantially the same way in which it operates, i.e., hanging from a raised support. However, test fixture 104 supports OTV 92 during analysis in a stationary state. In order to provide this function, as shown in FIGS. 2B and 3-5, test fixture 104 includes a rotatable bearing set 110 for rotatably engaging a wheel 98 (FIG. 5) of OTV 92 during testing. Each bearing set 110 may include a pair of rotatable bearings 114A, 114B (FIG. 3) for rotatably engaging an OTV wheel 98 (FIG. 5). Although test fixture 104 is shown including two rotatable bearing sets 110, it should be recognized that a rotatable bearing set 110 may be provided for each wheel 98 (FIG. 5) of an OTV 92, i.e., one or greater than two bearing sets may be provided depending on OTV 92.

In one embodiment, test fixture 104 includes a raised bearing support 118 for supporting OTV 92 in a position substantially similar to that in which OTV 92 operates, i.e., hanging from a raised support. Bearing support 118 may include a mounting structure for each individual bearing set 110. In one preferred embodiment, however, bearing support 118 includes a rail 120 that has a shape substantially similar to a rail upon which OTV 92 normally operates. Use of a rail 120 makes manufacturing test fixture 104 less expensive since it can be fabricated from a structure that is already available for use with OTV 92. In addition, placement of OTV 92 on test fixture 104 is aided by rail 120 since the rail readily accommodates OTV 92 even when the OTV is not positioned on bearing set(s) 110. Power for OTV 92 is provided by an external power source 121, e.g., an AC power supply, rather than an induction system as would occur during actual operation of OTV 92.

In the example shown, rail 120 is C-shaped and is positioned to include a first, lower extremity 122, a second, upper extremity 124 and a connecting back 126. Each bearing set 110, in this case, is positioned in an opening 128 (FIG. 3) of second, lower extremity 122, upon which OTV wheels 98 would normally ride. As shown best in FIG. 4, each bearing set 110 may be secured as necessary, e.g., by mounting plates 130. It should be recognized that rail 120 may take a variety of forms depending on the particular OTV 92 to be tested. Accordingly, the invention should not be limited to any particular rail shape.

Data collector 106 may include any now known or later developed device for collecting data regarding an operating parameter of OTV 92. An "operating parameter" may be any characteristic of OTV 92 that affects how the OTV operates. For example, operation parameters may include drive servomotor velocity, current gain, current offset, an OTV travel profile (e.g., acceleration ramp, deceleration ramp, operating speed(s), etc.), optical sensor op-amp gain, etc. In one preferred embodiment, data collector 106 includes one of a handheld tachometer 107A and a handheld optical sensor 107B. In this case, data collector 106 is positionable in a data collector opening 140 in second, upper extremity 124 (FIGS. 2A, 2B, 3 and 5) over a bearing set 110 through which an OTV wheel 98 can be observed. Data collector 106 also may include a data analyzer 108 for analyzing an operation parameter of OTV 92. Data analyzer 108 may include any now known or later developed mechanism for analyzing data such as a computer system, electronic display, oscilloscope, etc.

Returning to FIGS. 2A-2B, test fixture 104 may also include a reflective section 146, e.g., a reflective tape, for interaction with an optical sensor(s) 100 (FIG. 5). In this fashion, test fixture 104 may also be used to test and calibrate optical sensor(s) 100, i.e., adjust an op-amp gain of an optical sensor. In this case, data collector 106 may be an electrical meter for collecting a reading (operation parameter) of an optical sensor 100. Reflective section 146 may be provided, for example, as a reflective tape that includes a number of lanes, each lane for interaction with a different optical sensor 100 of OTV 92.

Figure 6:
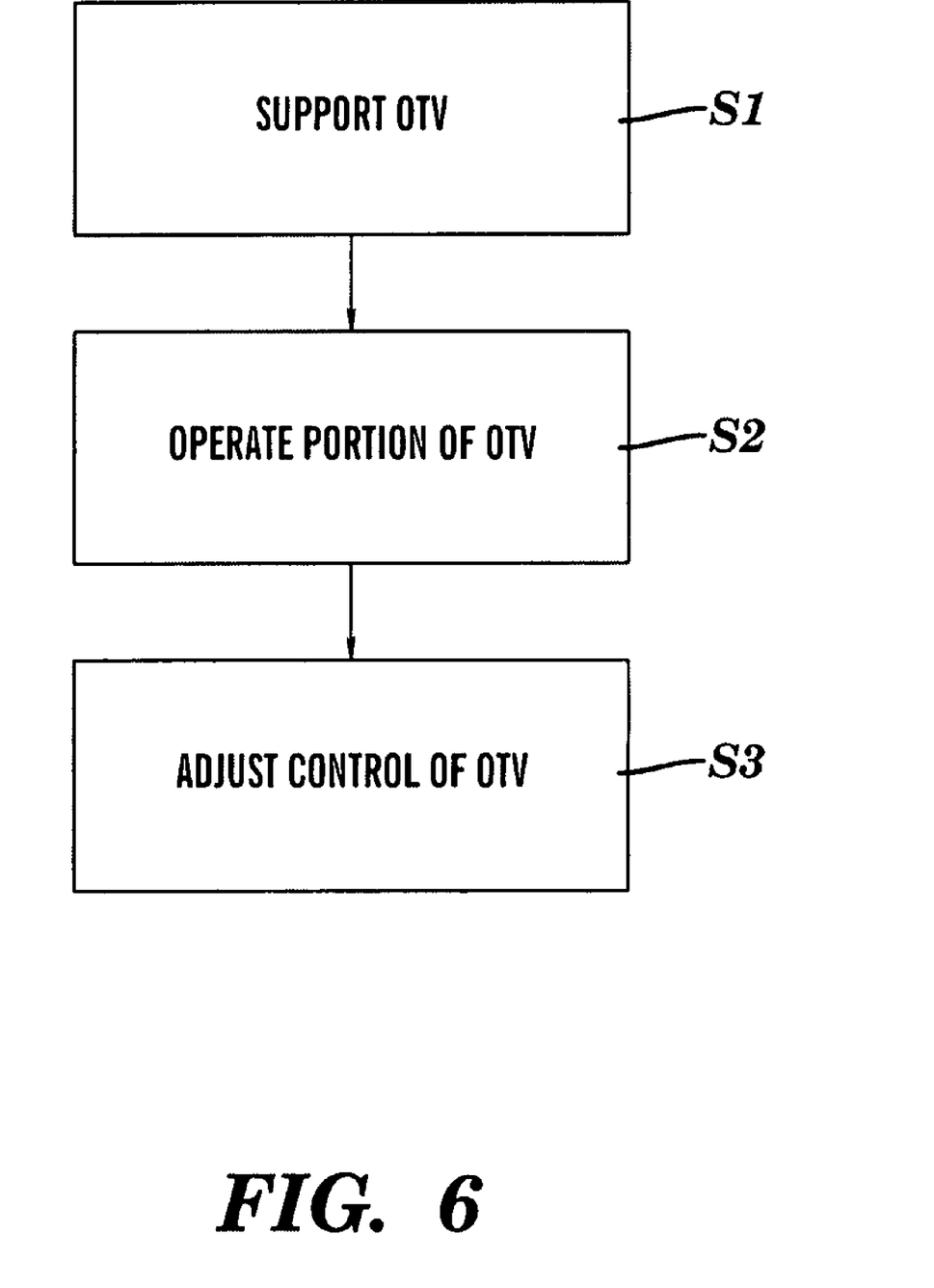
FIG. 6 shows a partial cross-sectional view of wheels of an overhead traveling vehicle positioned on the test fixture of FIGS. 2A-2B.

Referring to FIG. 6, a flow diagram of a method of calibrating an OTV 92 is shown. In a first step S1, an OTV 92 is supported on test fixture 104, in a stationary state, by rotatably supporting each wheel 98 (FIG. 5) of OTV 92 with a rotatable bearing set 110 including a pair of rotatable bearings 114A, 114B. In a second step S2, a portion of OTV 92 is operated. The "portion" may include any or all parts of OTV 92 such as servomotor(s) 96, optical sensors 100 or any other part. In a third step S3, a control(s) of OTV 92 is adjusted to calibrate OTV 92. The "control" may include, for example, one or more potentiometers 97 (FIG. 5) on a servomotor 96, an op-amp gain control 99 (FIG. 5) of an optical sensor 100, or a mount (not shown) that can change a physical position of an optical sensor 100. It should be recognized that the position of potentiometer(s) 97 and op-amp gain control 99 are for illustration purposes only, they may be positioned elsewhere on OTV 92. Adjustment may be manual or automatic depending on the particular control features provided. Where an OTV 92 being tested is one that is to take the place of a problem OTV, the adjusting step includes calibrating OTV 92 to have an operation parameter that substantially matches that of the problem or replaced OTV. For example, an OTV 92 may have its controls set to match the speed(s) of a replaced OTV such that it operates substantially similar to the replaced OTV when that OTV is operating correctly. Otherwise, an OTV 92 may be calibrated to a set of standards of, for example, a particular system, manufacturer, OTV model, etc. Internal calibration of OTV 92 may also occur such as synchronization of servomotors 96, i.e., master and slave, operate at the same velocity.

With specific regard to optical sensor 100 adjustment, it should be recognized that stationary operation of OTV 92 is not necessary. For example, OTV 92 may be moved on rail 120 during testing of optical sensor(s) 100. Further, it should be recognized that adjustment may include adjustment of a physical position of an optical sensor 100 to ensure detection of a reflective section 146.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A system for testing an overhead traveling vehicle, the system comprising:
    a test fixture for supporting the overhead traveling vehicle in a stationary state during analysis, the test fixture including;
      a C-shaped rail; and
      a stationary rotatable bearing set for rotatably engaging a wheel of the overhead traveling vehicle during testing, wherein the stationary rotatable bearing set is mounted to the C-shaped rail and the stationary rotatable bearing set is positioned only in a lower extremity of the C-shaped rail; and a data collector for collecting data regarding an operation parameter of the overhead traveling vehicle.

2. The system of claim 1, wherein the rail further includes an opening in an upper extremity thereof over the bearing set.

3. The system of claim 2, wherein the data collector includes one of a handheld tachometer and a handheld optical sensor, positionable in the opening to observe the wheel.

4. The system of claim 1, wherein the data collector further comprises a data analyzer for analyzing the operation parameter of the overhead traveling vehicle.

5. The system of claim 4, wherein the test fixture further includes a reflective section and the overhead traveling vehicle includes an optical sensor for interaction with the reflective section, and wherein the operation parameter includes a reading of the optical sensor.

6. The system of claim 1, wherein the test fixture further includes a reflective section and the overhead traveling vehicle includes at least one optical sensor for use with the reflective section.

7. The system of claim 6, wherein the operation parameter includes a reading of the optical sensor.

8. A test fixture for supporting an overhead traveling vehicle for testing, the test fixture comprising:
a stationary rotatable bearing set for rotatably engaging a wheel of the overhead traveling vehicle such that the wheel can rotate but the overhead traveling vehicle remains stationary; and
a raised support for supporting the rotatable bearing set, wherein the raised support includes a C-shaped rail, and the stationary rotatable bearing set is mounted to the C-shaped rail and the stationary rotatable bearing set is positioned only in a lower extremity of the C-shaped rail.

9. The test fixture of claim 8, wherein the C-shaped rail further includes an opening in an upper extremity thereof over the rotatable bearing set for a data collector.

10. The test fixture of claim 8, further comprising a reflective section on the rail for interaction with an optical sensor of the overhead traveling vehicle.

11. The test fixture of claim 10, wherein the reflective section includes a plurality of tape lanes, each lane for interaction with a different optical sensor of the overhead traveling vehicle.

12. A method of calibrating an overhead traveling vehicle, the method comprising:
supporting the overhead traveling vehicle on a test fixture, in a stationary state, by rotatably supporting each wheel of the overhead traveling vehicle with a stationary rotatable bearing set including a pair of rotatable bearings mounted to a C-shaped rail, wherein the pair of rotatable bearings are positioned only in a lower extremity of the C-shaped rail;
operating a portion of the overhead traveling vehicle; and
adjusting a control of the overhead traveling vehicle to calibrate the overhead traveling vehicle.

13. The method of claim 12, wherein the test fixture includes a reflective section for interaction with an optical sensor of the overhead traveling vehicle, and wherein the operating step includes activating the optical sensor and the adjusting step includes adjusting a control of the optical sensor.

14. The method of claim 12, wherein the operating step includes driving each wheel with a respective servomotor, and the adjusting step includes adjusting at least one servomotor control.

15. The method of claim 12, wherein the adjusting step includes calibrating the overhead traveling vehicle to have an operation parameter that substantially matches that of a replaced overhead traveling vehicle.

* * * * *